US007012826B2

(12) United States Patent
Barth, Jr.

(10) Patent No.: US 7,012,826 B2
(45) Date of Patent: Mar. 14, 2006

(54) BITLINE TWISTING STRUCTURE FOR MEMORY ARRAYS INCORPORATING REFERENCE WORDLINES

(75) Inventor: John E. Barth, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 10/708,917

(22) Filed: Mar. 31, 2004

(65) Prior Publication Data

US 2005/0226024 A1 Oct. 13, 2005

(51) Int. Cl.
*G11C 5/06* (2006.01)

(52) U.S. Cl. .................... 365/63; 365/156; 365/230.03
(58) Field of Classification Search ................. 365/63, 365/156, 230.03, 181, 205, 190, 206, 202
See application file for complete search history.

(56) References Cited

U.S. PATENT DOCUMENTS

| 4,914,502 | A | 4/1990 | Lebowitz et al. |
| 5,140,556 | A | 8/1992 | Cho et al. |
| 5,732,010 | A | 3/1998 | Takashima et al. |
| 6,370,055 | B1 | 4/2002 | Hanson et al. |
| 6,498,758 | B1 | 12/2002 | Pomar et al. |
| 6,501,675 | B1 | 12/2002 | Pilo et al. |
| 6,504,766 | B1 | 1/2003 | Pilo et al. |
| 6,510,093 | B1 | 1/2003 | Dhong et al. |
| 6,570,794 | B1 | 5/2003 | Hokenmaier et al. |
| 6,577,548 | B1 | 6/2003 | Barth, Jr. et al. |
| 6,795,331 | B1 * | 9/2004 | Noro ........................... 365/145 |
| 2001/0011735 | A1 | 8/2001 | Takeda |
| 2002/0056912 | A1 * | 5/2002 | Roth et al. ................... 257/750 |

OTHER PUBLICATIONS

Ad. J. van de Goer and Ivo Schanstra; "Address and Data Scrambling: Causes and Impact on Memory Tests;" Proceedings of the First IEEE International Workshop on Electronic Design, Test and Applications; 2002.

* cited by examiner

*Primary Examiner*—Van Thu Nguyen
*Assistant Examiner*—Dang T. Nguyen
(74) *Attorney, Agent, or Firm*—Robert A. Walsh; Cantor Colburn LLP

(57) ABSTRACT

A bitline structure for a memory array includes a first pair of complementary bitlines and a second pair of complementary bitlines. Both the first and second pair of complementary bitlines have a twist at a location corresponding to about ¼ of the total length of the bitline structure. The second pair of complementary bitlines further have a twist at a location corresponding to about ½ of the total length of the bitline structure, and both the first and second pair of complementary bitlines have a twist at a location corresponding to about ¾ the total length of the bitline structure.

13 Claims, 3 Drawing Sheets

BITLINE TWISTING STRUCTURE FOR MEMORY ARRAYS INCORPORATING REFERENCE WORDLINES

BACKGROUND OF INVENTION

The present invention relates generally to integrated circuit memory devices and, more particularly, to a bitline twisting structure for memory arrays incorporating reference wordlines.

Semiconductor integrated circuits typically are formed by MOS (metal oxide semiconductor) or by bipolar transistors that are integrated at a top planar major surface of a silicon chip. Electrical interconnections between various transistors, as well as between certain transistors and access pins typically located along the periphery of the chip, have typically taken the form of two (or more) "levels" of interconnections, i.e., electrically conducting lines in the form of metallization stripes running along two (or more) essentially planar surfaces that are oriented mutually parallel to, and are insulated from, both each other and the top planar surface of the chip by suitable insulating layers. Interconnection vias (windows) in the insulating layers are provided whenever they are needed in accordance with the desired circuit interconnections.

In a variety of such integrated circuits, such as random access memories (RAM) and logic circuits, the electrical circuit requires interconnections by means of a number of electrically conducting lines which conveniently are geometrically arranged in the form of an array of mutually parallel metallization stripes. For example, in a DRAM (dynamic RAM), within an array of parallel bitlines the unavoidable parasitic capacitance across each pair of neighboring bitlines gives rise to electrical cross-coupling or "cross-talk" therebetween.

More specifically, during read operations, only a small differential voltage (e.g., on the order of about 100 mV) between the true bitline and the complementary bitline is used by the sense amplifier since a larger differential voltage would increase the read time. Thus, in order to reduce the effects of a large mutual capacitance between adjacent bitlines, the complementary bitlines within a given bitline pairs are twisted at various locations along the length thereof. Generally, even numbered bitline pairs are twisted at different locations with respect to adjacent odd numbered bitline pairs. For example, along the entire length of a plurality of bitline pairs, the even numbered bitline pairs might be twisted just once at the middle of the total length, while the odd numbered pairs are twisted once at ¼ of the total length, and again at ¾ of the total length. Because differential sense amplifiers use the both lines of a bitline pair to sense differential voltages, bitline twisting allows for a disturbing signal on neighboring bitline to impact both the true and complementary bitline of a bitline pair in the same way, without impact to the differential voltage.

One specific type of DRAM sensing scheme is what is known as a half-$V_{DD}$ sensing scheme, in which both the true and complementary bitlines are precharged to a value approximately halfway between a logic "1" voltage ($V_{DD}$) and a logic "0" voltage (ground). When a cell is coupled to the precharged bitline, the voltage thereof will then slightly increase or decrease, depending on the value of the bit stored in the cell, thus creating a differential with respect to the complementary bitline still at $V_{DD}/2$. However, for reasons known to those in the art, a ground sensing scheme may present a desirable alternative, wherein the bitline pair is precharged or restored to ground prior to a read operation. Because of the precharging to ground, reference wordlines needed to place a reference voltage (e.g., $V_{DD}/2$) on either the bitline or the complementary bitline in order to be able to read a "0" bit.

Unfortunately, the use of bitline twisting complicates such reference wordline schemes, in that reference cells for each "region" are required. In existing layouts, the reference cell regions tend to be centrally located so as to reduce the physical proximity between a reference cell and the regions supported by the cell. On the other hand, a central location of a reference region has a negative impact on available device real estate, due to the additional devices associated with a reference region.

Accordingly, it would be desirable to configure a bitline twisting scheme such that the reference cell regions could be moved to the outer ends of the bitlines, while still being in relatively close proximity to the cell regions supported thereby.

SUMMARY OF INVENTION

The foregoing discussed drawbacks and deficiencies of the prior art are overcome or alleviated by a bitline structure for a memory array. In an exemplary embodiment, the bitline structure includes a first pair of complementary bitlines and a second pair of complementary bitlines. Both the first and second pair of complementary bitlines have a twist at a location corresponding to about ¼ of the total length of the bitline structure. The second pair of complementary bitlines further have a twist at a location corresponding to about ½ of the total length of the bitline structure, and both the first and second pair of complementary bitlines have a twist at a location corresponding to about ¾ of the total length of the bitline structure.

In another embodiment, a memory array includes a bitline structure having a first pair of complementary bitlines and a second pair of complementary bitlines, each associated with a number N of wordline rows. Both the first pair and second pair of complementary bitlines have a twist at a location corresponding to about an N/4 row location. The second pair of complementary bitlines further have a twist at a location corresponding to about an N/2 row location. Both the first and second pair of complementary bitlines have a twist at a location corresponding to about a 3N/4 row location.

BRIEF DESCRIPTION OF DRAWINGS

Referring to the exemplary drawings wherein like elements are numbered alike in the several Figures.

DETAILED DESCRIPTION

Disclosed herein is a novel bitline twisting scheme that may be applied to, for example, DRAM memory circuits employing true and complementary bitlines for data cell sensing operations. In particular, the bitline twisting scheme may be applied for rail level sensing schemes (e.g., ground sensing or $V_{DD}$ sensing) where the bitlines are precharged to one of the rail voltages such that a reference cell is used to apply a reference voltage (e.g., $V_{DD}/2$) on either the bitline or the complementary bitline to generate a differential voltage during a read operation. Briefly stated, the bitline twisting scheme provides (for a memory array having N rows, or wordlines) two pairs of bitlines having a double twist at the N/4 and 3N/4 row location and a single twist (i.e., one of the two pairs are twisted) at the N/2 row location. This configuration, in one embodiment, allows for both placement of the reference regions at the ends of the array, as well as maintaining the corresponding reference cells in relatively close proximity with the wordlines serviced thereby.

Figure 1:
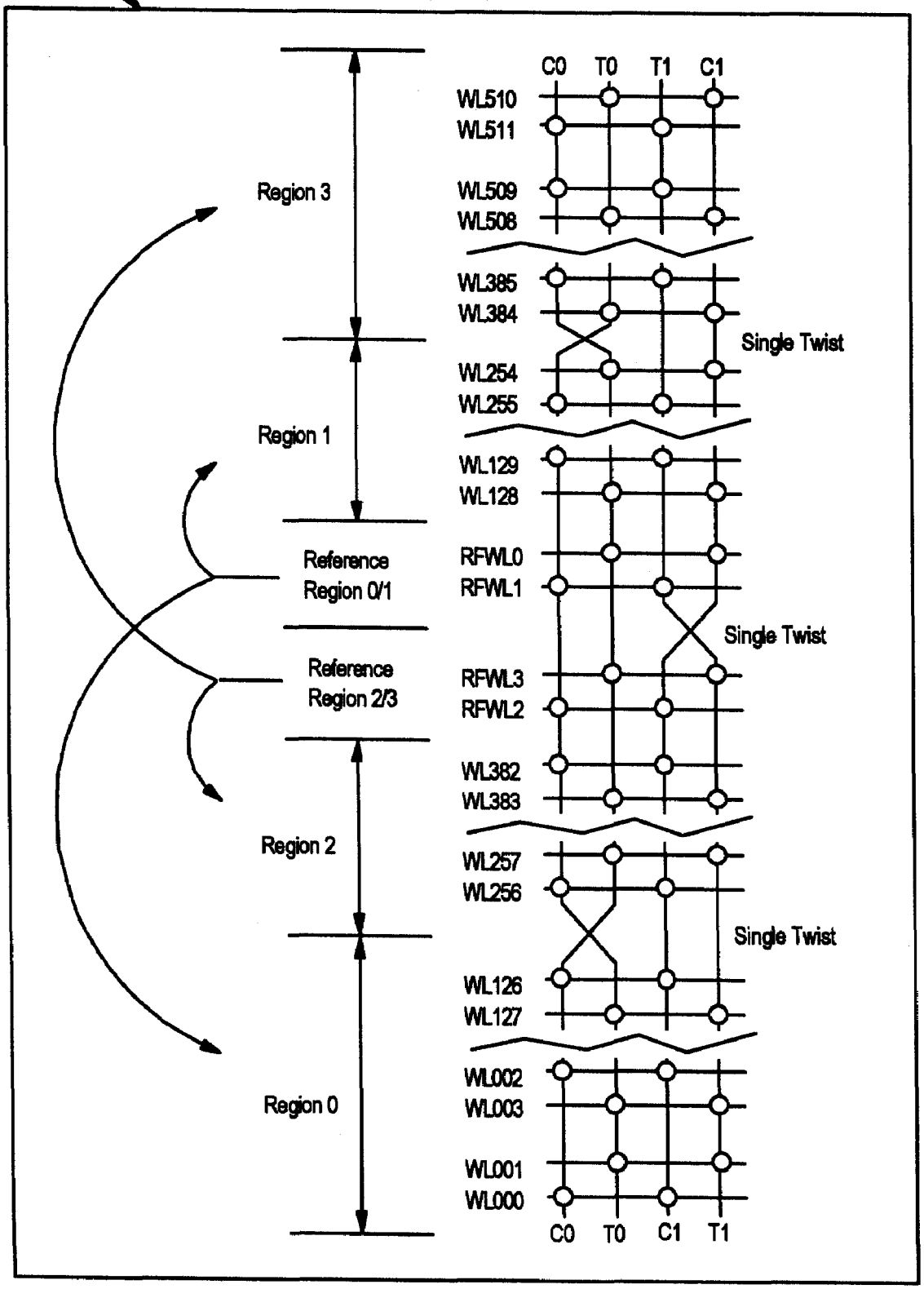
FIG. 1 is a schematic circuit diagram of an existing bitline twisting scheme for a DRAM array layout utilizing reference cell regions.

Referring initially to FIG. 1, there is shown a schematic circuit diagram of an existing bitline twisting scheme for a DRAM array 100 utilizing reference cell regions. In the example depicted, the array 100 includes 512 wordlines (labeled WL000–WL511) and two pairs of complementary bitlines (C0, T0 and C1, T1). It should be appreciated that the number of wordlines and bitline pairs is exemplary only, and that the array may include a different number of such wordlines and bitline pairs. Moreover, for ease of illustration, other wordline structures (such as redundant wordlines and equalizing lines) are not shown. In addition to the wordlines WL000–WL511, the array 100 further includes four reference wordlines labeled RFWL0 through RFWL3. As can be seen from FIG. 1, the conventional bitline twisting scheme therein includes two single twists for the even numbered bitline pair (C0, T0), at ¼ of the total length, and again at ¾ of the total length, while a single twist is used for the odd numbered bitline pair (C1, T1), at ½ of the total length.

As will be also noted from FIG. 1, the legend to the left of the array 100 provides a labeling designation of the different regions of the array 100. In particular, the lower half of the array includes (from bottom to top) region 0 and region 2, while the upper half of the array 100 includes region 1 and region 3. In the middle of the array, reference region 2/3 services region 2 (directly adjacent thereto), as well as region 3 (at the top of the array). In addition, reference region 0/1 services region 0 (at the bottom of the array), as well as region 1 (directly adjacent thereto).

The relative positioning of the reference regions is dictated primarily by the conventional bitline twisting scheme of FIG. 1, as well as the consideration to minimize the distance between a selected cell to be read and the particular reference cell used to provide the $V_{DD}/2$ voltage to the complementary bitline with respect to the selected cell. In other words, it would not be desirable, for example, to read a cell at the very bottom of the array and at the same time be forced to have the appropriate reference cell located at the very top of the array. Such a configuration may provide an undesirable delay in signal development due to charge transfer through the resistance provided by a long length of bitline wiring.

Figure 2:
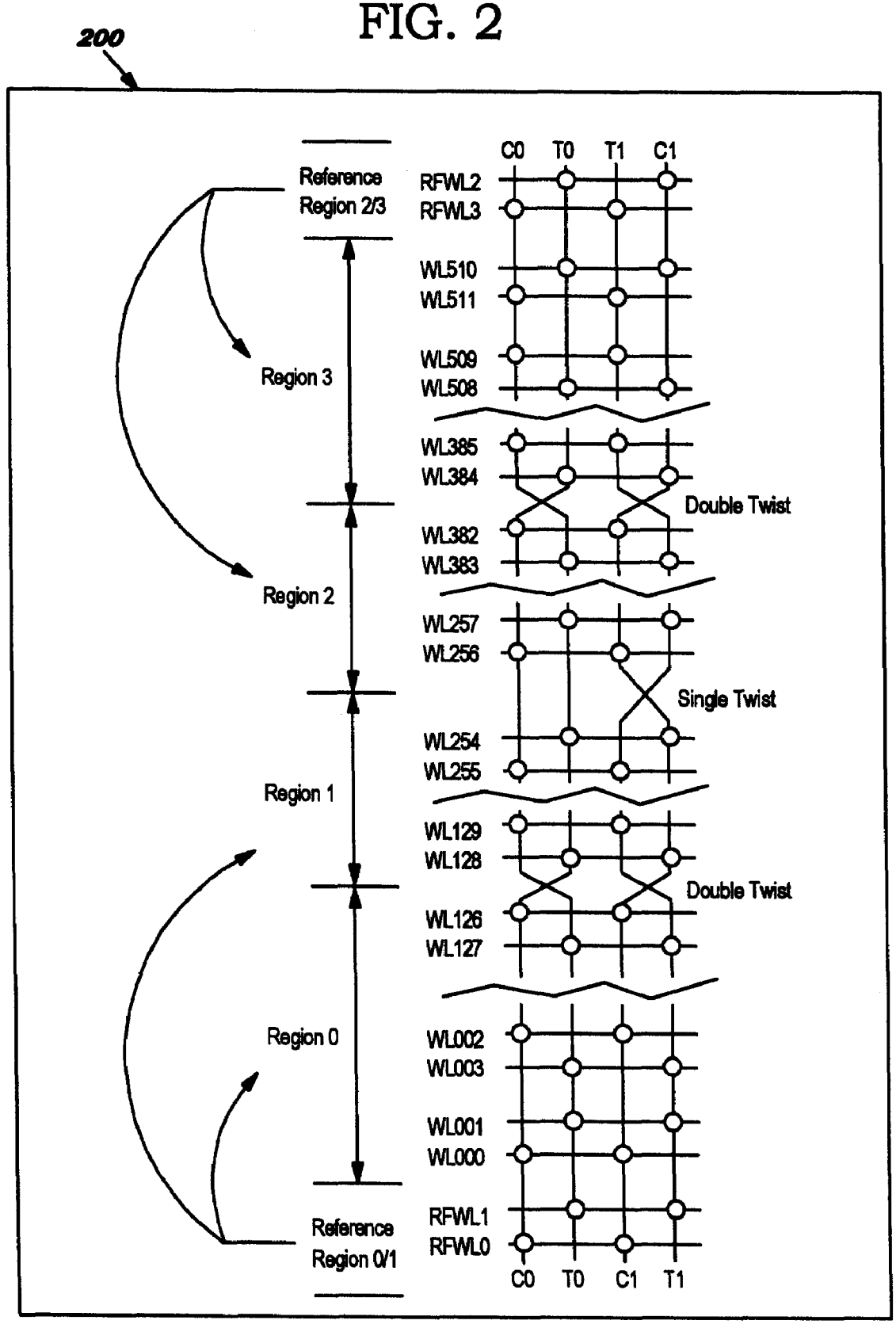
FIG. 2 is a schematic circuit diagram of a bitline twisting scheme for a DRAM array layout utilizing reference cell regions, in accordance with an embodiment of the invention.

Therefore, in accordance with an embodiment of the invention, there is disclosed a bitline twisting scheme that may be applied to, for example, DRAM memory circuits employing true and complementary bitlines for data cell sensing operations. Referring now to FIG. 2, an embodiment of a bitline twisting scheme for a DRAM array 200 utilizing reference cell regions is shown. For ease of comparison, the array embodiment 200 depicted in FIG. 2 also includes 512 wordlines (labeled WL000 WL511) and two pairs of complementary bitlines (C0, T0 and C1, T1). As is shown, the twisting scheme is configured such that there is a double twist at the ¼ and ¾ locations along the length of the bitlines. That is, both pairs of bitlines (C0, T0 and C1, T1) are twisted at the same location at N/4 and at 3N/4. Furthermore the odd numbered bitline pair (C1, T1) is also twisted at the N/2 location along the length of the bitlines.

Thus configured, the double twist/single twist/double twist bitline arrangement provides desired noise cancellation, as well as the capability of moving the reference regions 0/1 and 2/3 to the lower most and upper most portions of the array length, as shown by the legend adjacent the array 200. More specifically, reference region 0/1 is located at the bottom of the array 200 and services regions 0 and 1, both located in the bottom half of the array. Similarly, reference region 2/3 is located at the top of the array 200, and services regions 2 and 3, both located in the top half of the array 200.

An inspection of the bitline twisting scheme and the placement of the reference regions with respect to the wordline regions will reveal that both noise cancellation and reference cell proximity considerations are both taken into account into the present design. For example, a strong signal on T0 will have an effect on adjacent coplanar line C1 only along the bottom quarter (region 0) of the array. Tracing the signal path of T0 upward within the array, it is seen that T0 is twisted so that it is no longer adjacent with the either of the bitline conductors T1 or C1 through the next two quarters of the array (i.e., through regions 1 and 2). Finally, T0 crosses back over to its original position in region 3. However, instead of again being adjacent to C1, T0 is now adjacent to T1 in the top quarter of the array, due to the present twisting scheme. Accordingly, any effects of a strong signal coupling from T0 to C1 are substantially duplicated from T0 to T1, thus provide common mode noise cancellation. Stated another way, as between adjacent bitline pairs, the present bitline twisting scheme will still provide each possible combination of "inter pair" couplings through each of the four quadrants.

Unlike the array 100 of FIG. 1, however, the array 200 may also be configured to provide the reference regions at the upper and lower most ends of the array, but without resulting in lengthy distances between the reference wordlines and the cell wordlines. This is understood by reference once again to the conventional scheme of FIG. 1. If the reference regions were moved to the outer edges of the array 100, each reference region would have to serve one wordline region at the opposite end of the bitline structure. For example, if reference region 0/1 were moved to the top of the array, then it would still have to serve region 0 at the bottom of the array. Moreover, a reference region placed at the top of the array 100 could not serve both wordline regions at the top half of the array 100, because in the conventional bitline twisting scheme, only one of the bitline pairs has a twist between region 3 and region 1, and thus those two regions are out of phase with one another.

In contrast, with array 200, both bitline pairs have a twist at the ¼ and ¾ locations. Thus, the bitline pairs in the two top regions (3, 2) are in phase with one another, and are also in phase with one another in the two bottom regions 1, 0).

Figure 3:
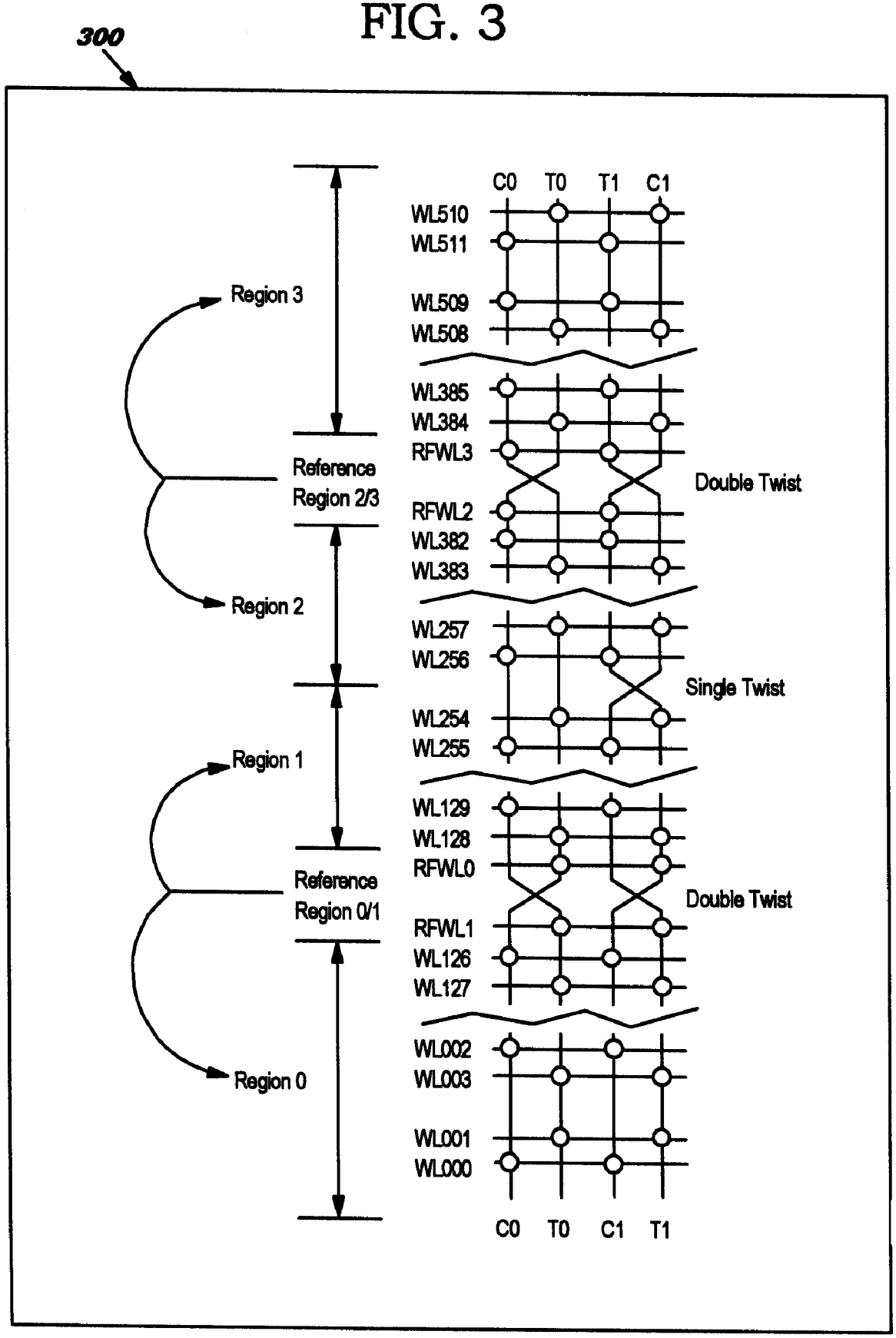
FIG. 3 is a schematic circuit diagram of a bitline twisting scheme for a DRAM array layout utilizing reference cell regions, in accordance with an alternative embodiment of the invention.

Finally, FIG. 3 illustrates an alternative embodiment of an array configuration 300, still using the same bitline twisting scheme introduced in FIG. 2. In lieu of locating the reference regions at the very outer ends of the array, the reference regions are instead located between their respective serviced wordline regions (i.e., at about the ¼ and ¾ locations). In this manner, the maximum distance between any given reference cell and any wordline cell is ¼ of the total bitline length. Accordingly, this embodiment provides a tradeoff between minimizing the reference wordline to array wordline distance, and locating the reference regions away from the center of the bitline structure.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A bitline structure for a memory array, comprising:
   a first pair of complementary bitlines;
   a second pair of complementary bitlines;
   both said first pair and said second pair of complementary bitlines having a twist at a location corresponding to about ¼ of the total length of the bitline structure;
   said second pair of complementary bitlines further having a twist at a location corresponding to about ½ of the total length of the bitline structure; and
   both said first pair and said second pair of complementary bitlines having a twist at a location corresponding to about ¾ of the total length of the bitline structure.

2. A memory array, comprising:
   a bitline structure including a first pair of complementary bitlines and a second pair of complementary bitlines, each associated with a number N of wordline rows;
   both said first pair and said second pair of complementary bitlines having a twist at a location corresponding to about an N/4 row location;
   said second pair of complementary bitlines further having a twist at a location corresponding to about an N/2 row location; and
   both said first pair and said second pair of complementary bitlines having a twist at a location corresponding to about a 3N/4 row location.

3. The memory array of claim 2, further comprising:
   a first reference wordline region of reference wordlines dedicated to row locations numbered less than N/2, and a second reference wordline region of reference wordlines dedicated to row locations numbered N/2 through N.

4. The memory array of claim 3, wherein said plurality of wordline rows further comprises:
   a first wordline region defined between a first end of said bitline structure and said N/4 row location;
   a second wordline region defined between said N/4 row location and said N/2 location;
   a third wordline region defined between said N/2 row location and said 3N/4 row location; and
   a fourth wordline region defined between said 3N/4 row location and a second end of said bitline structure.

5. The memory array of claim 4, wherein said first reference wordline region is located at said first end of said bitline structure and said second reference wordline region is located at said second end of said bitline structure.

6. The memory array of claim 4, wherein:
   said first reference wordline region is located between said first wordline region and said second wordline region; and
   said second reference wordline region is located between said third wordline region and said fourth wordline region.

7. The memory array of claim 2, further comprising a plurality of complementary bitline pairs, wherein:
   all even and odd numbered pairs of complementary bitlines each have a twist at a location corresponding to said N/4 row location;
   only odd numbered pairs of complementary bitlines have a twist at a location corresponding to said N/2 row location; and
   all even and odd numbered pairs of complementary bitlines have a twist at a location corresponding to said 3N/4 row location.

8. A dynamic random access memory (DRAM) array, comprising:
   a bitline structure including a first pair of complementary bitlines and a second pair of complementary bitlines, each associated with a number N of wordline rows;
   both said first pair and said second pair of complementary bitlines having a twist at a location corresponding to about an N/4 row location;
   said second pair of complementary bitlines further having a twist at a location corresponding to about an N/2 row location; and
   both said first pair and said second pair of complementary bitlines having a twist at a location corresponding to about a 3N/4 row location.

9. The DRAM array of claim 8, further comprising:
   a first reference wordline region of reference wordlines dedicated to row locations numbered less than N/2, and a second reference wordline region of reference wordlines dedicated to row locations numbered N/2 through N;
   wherein said reference wordlines in said first and said second reference wordline regions are configured in accordance with a rail voltage level sensing scheme.

10. The DRAM array of claim 9, wherein said plurality of wordline rows further comprises:
    a first wordline region defined between a first end of said bitline structure and said N/4 row location;
    a second wordline region defined between said N/4 row location and said N/2 location;
    a third wordline region defined between said N/2 row location and said 3N/4 row location; and
    a fourth wordline region defined between said 3N/4 row location and a second end of said bitline structure.

11. The DRAM array of claim 10, wherein said first reference wordline region is located at said first end of said bitline structure and said second reference wordline region is located at said second end of said bitline structure.

12. The DRAM array of claim 10, wherein:
    said first reference wordline region is located between said first wordline region and said second wordline region; and
    said second reference wordline region is located between said third wordline region and said fourth wordline region.

13. The DRAM array of claim 8, further comprising a plurality of complementary bitline pairs, wherein:
    all even and odd numbered pairs of complementary bitlines each have a twist at a location corresponding to said N/4 row location;
    only odd numbered pairs of complementary bitlines have a twist at a location corresponding to said N/2 row location; and
    all even and odd numbered pairs of complementary bitlines have a twist at a location corresponding to said 3N/4 row location.

* * * * *